United States Patent
Wu et al.

(10) Patent No.: US 7,244,651 B2
(45) Date of Patent: Jul. 17, 2007

(54) FABRICATION OF AN OTP-EPROM HAVING REDUCED LEAKAGE CURRENT

(75) Inventors: Xiaoju Wu, Irving, TX (US); Jozef Mitros, Richardson, TX (US); Pinghai Hao, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 347 days.

(21) Appl. No.: 10/442,524

(22) Filed: May 21, 2003

(65) Prior Publication Data

US 2004/0235246 A1 Nov. 25, 2004

(51) Int. Cl.
*H01L 21/336* (2006.01)

(52) U.S. Cl. .............. 438/257; 257/214; 257/E21.179; 257/E21.422; 257/E29.3

(58) Field of Classification Search ............... 438/200, 438/217, 282, 289, 291, 231, 257, 314, 315
See application file for complete search history.

(56) References Cited

U.S. PATENT DOCUMENTS

| | | | |
|---|---|---|---|
| 5,574,685 A | | 11/1996 | Hsu |
| 5,606,518 A * | | 2/1997 | Fang et al. ............ 703/13 |
| 5,923,975 A * | | 7/1999 | Rolandi ............ 438/258 |
| 6,071,775 A * | | 6/2000 | Choi et al. ............ 438/257 |
| 6,075,718 A | | 6/2000 | Fontana et al. |
| 6,323,143 B1 | | 11/2001 | Yu |
| 6,420,223 B2 | | 7/2002 | Camerlenghi |
| 6,433,392 B1 | | 8/2002 | Amerasekera et al. |
| 6,448,121 B1 | | 9/2002 | Brighton |
| 6,469,341 B1 | | 10/2002 | Sung et al. |
| 6,509,606 B1 | | 1/2003 | Merrill et al. |
| 6,514,810 B1 | | 2/2003 | Kim et al. |
| 6,649,983 B2 * | | 11/2003 | Chatterjee ............ 257/370 |
| 6,717,221 B2 * | | 4/2004 | Post et al. ............ 257/376 |
| 6,743,291 B2 * | | 6/2004 | Ang et al. ............ 117/90 |
| 6,774,707 B1 * | | 8/2004 | Smith et al. ............ 327/536 |
| 6,909,138 B2 * | | 6/2005 | Forbes ............ 257/315 |
| 2003/0203550 A1 * | | 10/2003 | Lai et al. ............ 438/199 |

* cited by examiner

*Primary Examiner*—Quoc Hoang
(74) *Attorney, Agent, or Firm*—Rose Alyssa Keagy; W. James Brady; Frederick J. Telecky, Jr.

(57) ABSTRACT

The leakage current of an OTP-EPROM cell formed using buried channel PMOS technology can be reduced. The reduction in leakage current of the OTP-EPROM can be achieved by blocking implantation of the $V_{tp}$ implant into a channel region of an n-well that substantially underlies a floating gate structure. The $V_{tp}$ implant can be blocked by providing a mask overlying the surface of the channel region of the n-well during implantation of the $V_{tp}$ implant.

23 Claims, 4 Drawing Sheets

FABRICATION OF AN OTP-EPROM HAVING REDUCED LEAKAGE CURRENT

TECHNICAL FIELD

The present invention relates generally to processes for the manufacture of semiconductors and, more particularly, to the fabrication of a one time programmable (OTP) electrically programmed read only memory (EPROM) cell.

BACKGROUND OF THE INVENTION

One time programmable (OTP) electrically programmed read only memory (EPROM) can be an effective, low cost technology for providing non-volatile memory in a variety of CMOS or PMOS processes. A basic OTP-EPROM cell can be a simple enhancement-mode p-channel MOS field effect transistor (MOSFET) built in an n-well like any other p-channel MOSFET except that there is no connection to the poly gate. The OTP-EPROM cell can use a thin gate oxide (e.g., 75 Å to 200 Å range), no special masks or process steps, and is available in the base line process with no cost added to the basic CMOS or PMOS wafer price. However, special test requirements, multiple passes through a multi-probe, and the use of ultra violet (UV) light to erase the OTP-EPROM cell can increase the cost of a probed OTP-EPROM ready for assembly.

An OTP-EPROM cell can be designed using standard semi-conductor design rules. The minimum channel length allowed of an OTP-EPROM cell can be the same or slightly larger than the channel length of a p-channel MOS transistor. For example, if the minimum channel length of a p-channel MOS transistor is 0.4 µm, then the channel length of an OTP-EPROM cell can be 0.5 µm.

An OTP-EPROM cell can be programmed using a nominal voltage supply (e.g., 7.0 V) and can be expected to retain data through a 10 year operating life time at temperatures up to about 125° C. The power supply can be applied during the programming pulses. The read voltages should be kept below about 2.0 V to avoid any possibility of disturbance or degradation of data retention characteristics.

OTP-EPROM cells manufactured using CMOS processes with standard buried channel PMOS have a fairly high $I_{off}$ current (e.g., I virgin current) compared to the $I_{on}$ current (e.g., I programmed current). The high $I_{off}$ current of the OTP EPROM cell can reduce the operating margin of OTP-EPROM cell and can reduce its lifetime.

The $I_{on}/I_{off}$ ratio of an OTP-EPROM cell formed using buried channel PMOS technology can be improved by increasing the channel length of the OTP-EPROM. Increasing the channel length, however, usually results in the formation of an OTP-EPROM cell with a larger area. An OTP-EPROM cell with a larger area is undesirable as it prevents the formation of OTP-EPROMs with greater bit density. The $I_{on}/I_{off}$ ratio of the OTP-EPROM cell can also be improved by increasing the programmed state current of the OTP-EPROM cell or decreasing the leakage of virgin state current of the OTP-EPROM cell. Increasing the programmed state current is generally undesirable because a corresponding increased programming voltage and increased programming time are required. It is thus desirable to reduce the leakage of virgin state current in order to reduce the $I_{on}/I_{off}$ ratio and improve the operating margin of the OTP-EPROM.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to a method of fabricating an OTP-EPROM cell with reduced leakage current using buried channel PMOS technology. The OTP-EPROM cell can be fabricated by forming an N-well in the substrate, selectively implanting a threshold voltage PMOS ($V_{tp}$) implant into the n-well to form a buried channel, and forming a floating gate structure overlying the n-well region. The reduction in leakage current of the OTP-EPROM cell can be achieved by blocking implantation of the $V_{tp}$ implant into a channel region of the n-well that substantially underlies the floating gate structure. For example, the $V_{tp}$ implant can be blocked by providing a mask overlying the surface of the channel region of the n-well during implantation of the $V_{tp}$ implant.

Blocking the implantation of the $V_{tp}$ implant into the channel region of the n-well inhibits formation of a buried channel within the channel region of the n-well. The channel region underlying the floating gate structure thus remains in "natural" form. Providing a natural channel region underlying the floating gate structure reduces the leakage current of the OTP-EPROM cell in a virgin state to a noise, sub-pA level and improves the operating margin of the OTP-EPROM cell.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates generally to a fabrication method for an OTP-EPROM cell formed using buried channel PMOS technology. The OTP-EPROM cell can have a reduced leakage current compared to a conventional OTP-EPROM cell formed using buried channel PMOS technology. The reduction in leakage current of the OTP-EPROM cell can be achieved by blocking the implantation of a $V_{tp}$ implant into a channel region of an n-well that substantially underlies a floating gate structure of the OTP-EPROM cell. By blocking the implantation of the $V_{tp}$ implant into the channel region, the channel region can be formed that can be of a "natural" type as opposed to being of an "implanted" type. This distinction is significant because the threshold voltage values of a natural PMOS transistor are typically greater than the threshold voltage values of a $V_{tp}$ implanted transistor. For example, an improvement in the threshold voltage of the channel region can reduce the current leakage of the OTP EPROM cell in a virgin state to a noise, sub-pA level and can improve the operating margin (i.e., I programmed/I virgin) by about $1 \times 10^6$ times compared to an OTP EPROM cell with a $V_{tp}$ implanted channel region.

Figure 1:
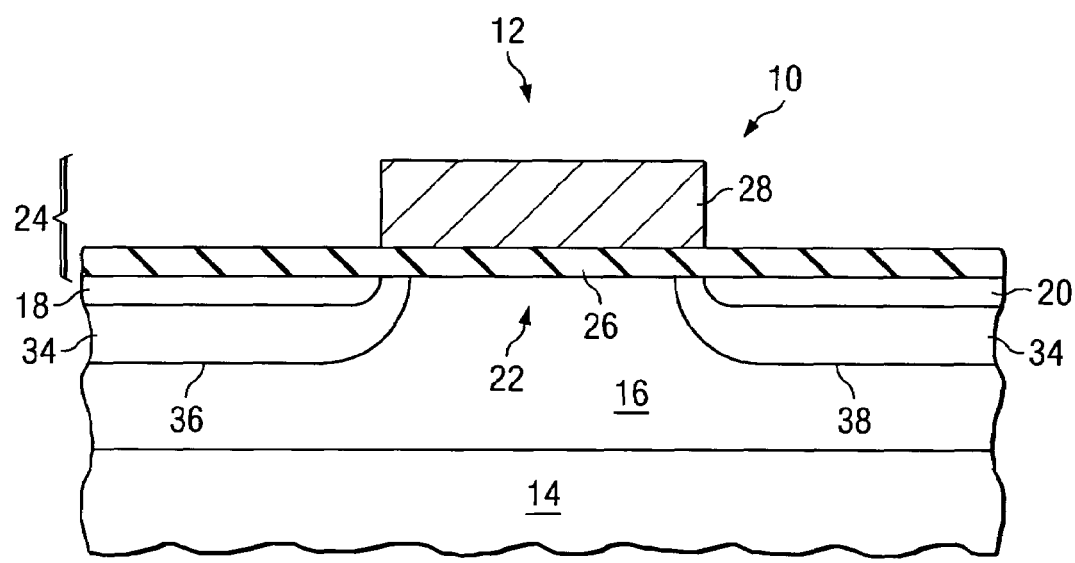
FIG. 1 is a schematic cross-sectional illustration of a PMOS structure of an OTP-EPROM cell.

FIG. 1 illustrates a buried channel PMOS structure 10 of an OTP EPROM cell 12 in accordance with an aspect of the invention. The PMOS structure 10 can be formed of a substrate material 14 having embedded therein an n-well 16. The substrate material 14 can be a p-type semiconductor material and the n-well 16 can be formed in the p-type semiconductor material, for example, by implanting an n-type dopant, such as phosphorous (P), in the p-type substrate material 14. It is to be appreciated that the OTP-EPROM cell 12 is provided for illustrative purposes and that the substrate 14 can include a plurality of OTP-EPROM cells and other integrated circuit devices.

The PMOS structure 10 of the OTP-EPROM cell 12 can include spaced apart source and drain regions 18 and 20, which are formed in the n-well 16, and a channel region 22, which is defined between the source and drain regions 18 and 20. The source region 18 and drain region 20 can be formed respectively by selectively implanting a high dose of a p-type dopant, such as boron 11 ($B_{11}$), boron difluoride ($BF_2$), or any other p-type dopant, in the n-well 16. The source region 18 and drain region 20 can also include a p-source contact and a p-drain contact (not shown). The source region 18 and drain region 20 can be silicided to reduce contact resistance and prevent junction spiking. A low dose p-type implant, in addition to the high dose p-type implant, can be implanted into the source region 18 and drain region 20. The purpose of this implant is to improve reliability of the OTP-EPROM cell and increase breakdown voltage.

A gate structure 24 can be defined over the channel region 22. The gate structure 24 includes a relatively thin gate dielectric layer 26 (i.e., having a uniform thickness between about 75 Å and about 125 Å) that can be formed (e.g., by thermal oxidation) over the channel region 22. The gate dielectric layer 26 can be an oxide (e.g., silicon dioxide ($SiO_2$)) or any other dielectric material suitable for use as an insulator in an EPROM device. A floating gate 28 can be formed (e.g., by CVD) over the gate dielectric layer 26. The floating gate 28 can comprise, for example, a polysilicon gate material or a re-crystallized polysilicon gate material.

The PMOS structure 10 of the OTP-EPROM cell 12 can also include a buried channel 34 that is disposed in the n-well 16 of the substrate material 14. The buried channel 34 can include a first region 36 and a second region 38. The fist region 36 and the second region 38 can be substantially separated by the channel region 22 and can include respectively the source region 18 and the drain region 20. The buried channel 34 can be formed, for example, by implanting a threshold voltage PMOS ($V_{tp}$) implant into the n-well 16. The $V_{tp}$ implant can set the threshold voltage for PMOS structure 10. The $V_{tp}$ implant can include dopants, such as $BF_2$, $B_{11}$, P, and/or any other dopant used as a $V_{tp}$ implant.

The $V_{tp}$ implant can be blocked during implantation so that $V_{tp}$ implant can be substantially inhibited from penetrating the channel region 22. By inhibiting the $V_{tp}$ implant from penetrating the channel region 22, a channel region 22 can be formed that is of the "natural" type as opposed to being of the "implanted" type.

The OTP-EPROM cell 12 can be in a virgin state (i.e., unprogrammed or erased (e.g., UV erased) or a programmed state. In a virgin state, the OTP EPROM cell 12 has little or no charge stored on the floating gate 28. Accordingly, the substrate material 14 is in accumulation, there is no conductive channel, and the OTP-EPROM cell 12 is off. When the drain voltage ($V_d$) is taken negative with respect to the source voltage ($V_s$), the drain current, at first, remains small, increasing only at a slow rate. Below 2 V, this is a completely reversible operation and may be used to read an erased OTP-EPROM cell 12. As the drain voltage increases further, the floating gate voltage ($V_{fg}$) increases because capacitive coupling between the drain 20 and floating gate 28. When $V_d = -3$ V, $V_{fg} = -0.6$ V and the drain current significantly increases. When the drain current is high enough, electrons can accelerate and become heated so that at least some will be injected through the dielectric layer 26 onto the floating gate 28. This creates a positive feedback loop, which quickly programs the OTP EPROM cell 12, charging the floating gate 28 by negative charge, and turning it on. This process will self limit as the negative charge on the floating gate 28 repels more electrons.

An OTP-EPROM cell with a natural channel region can have a programmed state drain current to the virgin state drain current ratio (i.e., current ratio (I programmed/I virgin)) substantially greater than the current ratio of an OTP-EPROM cell with a $V_{tp}$ implanted channel region. For example, an OTP-EPROM cell having a natural channel region with a length of about 1 μm has a current ratio of about $1.8 \times 10^6$ compared to a current ratio of about 110 for an OTP-EPROM cell with an about 1 μm in length $V_{tp}$ implanted channel region. Likewise, where the channel region has a length of 1.2 μm, an OTP-EPROM cell with a natural channel region has a current ratio (I programmed/I virgin) of $1.8 \times 10^6$ compared to a current ratio of about 194 for an OTP-EPROM cell with a $V_{tp}$ implanted channel region.

Figure 2:
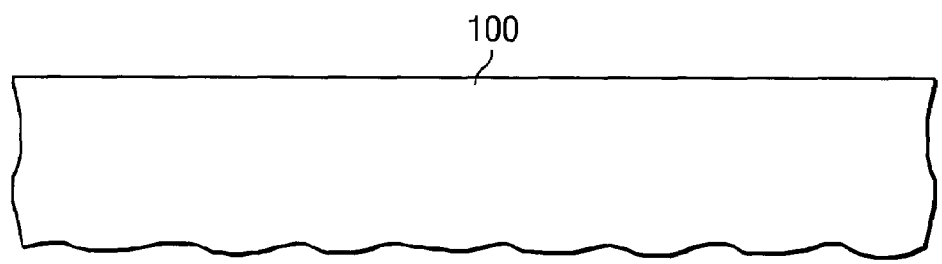
FIG. 2 illustrates a schematic cross-sectional view of a substrate.

FIGS. 2-10 illustrate a methodology of fabricating a part of a buried channel PMOS structure of an OTP EPROM cell in accordance with an aspect of the present invention. FIG. 2 illustrates a p-type substrate layer 100 that can be formed from a semiconductor material, such as silicon or polysilicon. The substrate layer 100, however, could be formed from any material, such as gallium arsenide, germanium, silicon-germanium, epitaxial formations, silicon carbide, indium phosphide, silicon-on-insulator substrates (SOI), strained Si substrates, and/or other semiconductor substrate materials.

Figure 3:
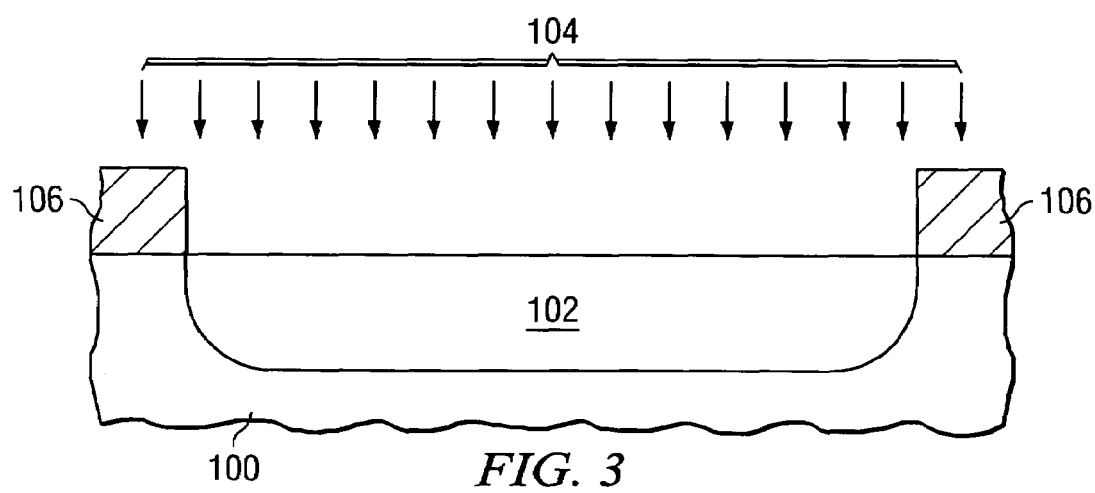
FIG. 3 illustrates a schematic cross-sectional view of the substrate of FIG. 2 undergoing implantation of an n-type dopant to form an n-well in accordance with an aspect of the present invention.

FIG. 3 illustrates an n-well 102 being formed in the p-type substrate layer 100 by implanting an n-type dopant 104, such as phosphorous and/or arsenic, into the p-type substrate layer 100. During formation of the n-well 102 in the p-type substrate layer 100, a patterned photoresist layer 106 can be provided on the substrate 100. The patterned photoresist layer 106 can have a thickness suitable for carrying out the present invention. Accordingly, the thickness of the patterned photoresist layer 106 can vary in correspondence with the wavelength of radiation used to pattern the photoresist layer. The patterned photoresist layer 106 can be formed by providing a photoresist layer over the substrate layer 100 via conventional spin-coating or spin casting deposition techniques. The photoresist layer can be etched (e.g., anisotropic reactive ion etching (RIE)) to provide a patterned photoresist layer. A selective etch technique can be used to etch the photoresist layer at a relatively greater rate as compared to the rate of the underlying substrate layer 100 to provide the patterned photoresist layer 106. The patterned photoresist layer 106 can used as a mask 106 to define the area of the n-well 102 during implantation of the n-type dopant 104.

The implantation of the n-type dopant 104 can be performed, for example, using an ion implanter that accelerates the dopant ions (e.g., P) at a high energy (e.g., about 150 to about 250 KeV). In an aspect of the invention, the n-well 102 can be formed with multiple implants, such as a channel stop implant ($C_S$) and a well implant ($W_I$) implant. The $C_S$ implant puts the peak doping concentration at the bottom of the n-well 102. It is designed to raise the turn-on voltage of the parasitic PMOS structure. The $C_S$ implant can comprise a phosphorous implant at doses of about $3\times10^{12}$ cm$^2$ to about $7\times10^{12}$ cm$^2$ at energies of about 180 keV to about 330 keV. The $W_I$ is a high-energy implant and forms a deep low resistance region in the n-well. This low resistance region keeps the voltage close to ground everywhere in the n-well 102 and prevents transient voltages from building up. The $W_I$ implant comprises a phosphorous implant at doses of about $2\times10^{13}$ cm$^2$ to about $9\times10^{13}$ cm$^2$ at energies of about 350 keV to about 850 keV.

After ion implantation, the patterned photoresist 106 can be stripped off the substrate 100 (e.g. Ultra-Violet (UV)/Ozone ($O_3$)/Sulfuric Acid ($H_2SO_4$) and cleaned by wet chemical cleanup processes. The wet chemical cleanup can include a surface cleaning process, such as an RCA (Radio Corporation of America) clean and/or a SPM (sulfuric acid-hydrogen peroxide-water solution) clean. The RCA clean is the industry standard for removing contaminants from wafers. The RCA cleaning procedure has three major steps used sequentially that are organic clean, oxide strip and ionic clean. Those skilled in the art would be familiar with a variety of different wet chemical cleanup procedures that can be employed to clean the structure.

Figure 4:
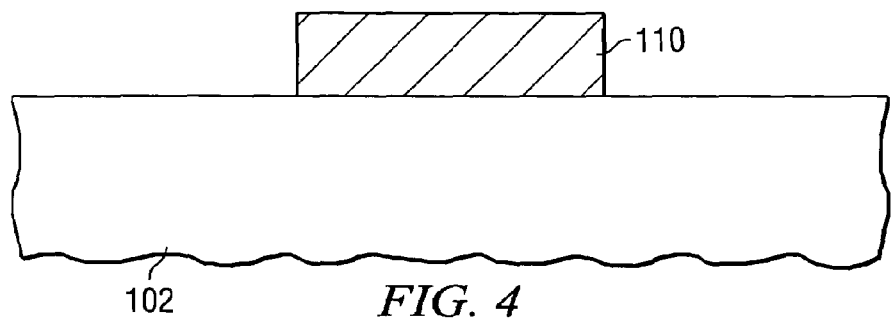
FIG. 4 illustrates a schematic cross-sectional view of the n-well of FIG. 3 after a first mask is formed over the n-well in accordance with an aspect of the present invention.

FIG. 4 illustrates the n-well 102 of the PMOS structure after a second patterned photoresist layer 110 is formed over the n-well. The second patterned photoresist layer 110 like the first patterned photoresist layer 106 can have a thickness suitable for carrying out the present invention. Accordingly, the thickness of the patterned photoresist layer 110 can vary in correspondence with the wavelength of radiation used to pattern the photoresist layer. The patterned photoresist layer 110 can be formed by providing a photoresist layer over the n-well 102 via conventional spin coating or spin casting deposition techniques. An etch step (e.g., anisotropic reactive ion etching (RIE)) can be performed to provide a patterned photoresist layer 110. The patterned photoresist layer 110 can be used as a mask 110 to define a natural PMOS region within the n-well during implantation of a threshold voltage PMOS ($V_{tp}$) implant. The second mask 110 can be sized such that the second mask 110 has an area substantially greater than the area of a floating gate, which is formed over the n-well during subsequent processing.

Figure 5:
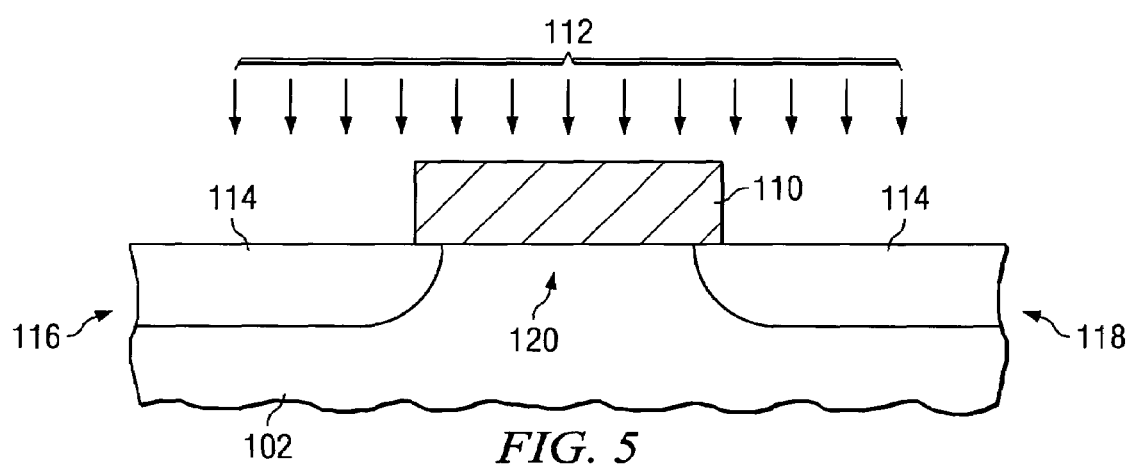
FIG. 5 illustrates a schematic cross-sectional view of the structure of FIG. 4 after undergoing implantation of a threshold voltage PMOS implant in accordance with an aspect of the present invention.

FIG. 5 illustrates the n-well 102 of the PMOS structure after implantation of a $V_{tp}$ implant 112 is initiated to form a buried channel 114 in the n-well 102 of the structure. The $V_{tp}$ implant 112 can be a low energy implant that can be used to adjust the threshold voltage of the PMOS structure. The implantation of $V_{tp}$ implant 112 can be performed using an ion implanter that accelerates dopant ions into the n-well 102. The dopant ions can comprise an n-type dopant (e.g., P or As), a p-type dopant (e.g., B, $B_{11}$, and/or $BF_2$), or a combination of an n-type dopant(s) and/or a p-type dopant(s). Those skilled in the art will understand and appreciate that other dopants can be used as the $V_{tp}$ implant 112.

The dose and energy used during implantation of the $V_{tp}$ implant 112 can vary depending on the particular dopant used. By way of example, where the $V_{tp}$ implant 112 comprises a combination of phosphorous (P) and boron difluoride ($BF_2$) dopants, the phosphorous dopant can be implanted at a concentration of about $2\times10^{12}$ cm$^2$ to about $16\times10^{12}$ cm$^2$ and an energy of about 100 keV to about 200 keV, and the $BF_2$ dopant can be implanted at a concentration of about $2\times10^{12}$ cm$^2$ to about $4\times10^{12}$ cm$^2$ and an energy of about 60 keV to about 80 keV.

The mask 110 covering the n-well 102 blocks the implantation of the $V_{tp}$ implant 112 into the n-well 102 so that the buried channel 114 can be formed with a spaced apart first buried channel region 116 and a second buried channel region 118. Those skilled in the art will appreciate that the mask 110 can be formed by borrowing process steps used to mask off other exposed areas of the substrate, such that no additional process steps are required to implement the masking and block the $V_{tp}$ implant 112. The first buried channel region 116 and second buried channel region 118 define a natural PMOS region 120 in the n-well 102 between the first buried channel region 116 and the second buried channel region 118. This natural PMOS region 120 extends substantially coextensive with the area of the n-well 102 underlying the mask 110. This natural PMOS region 120 can underlie the floating gate, which can be formed in subsequent processing.

The natural PMOS region 120 has a higher threshold voltage than PMOS that has been implanted with a $V_{tp}$ implant. This higher threshold voltage reduces the virgin state current leakage the OTP-EPROM cell and thus improves the current ratio (I programmed/I virgin) of the OTP-EPROM cell compared to OTP-EPROM cells in which the $V_{tp}$ implant is applied uniformly across the surface of the n-well.

Following implantation of the $V_{tp}$ implant 112 and formation of the buried channel 114, the second photoresist layer 110 can be stripped off the n-well 102 (e.g., Ultra-Violet (UV)/Ozone ($O_3$)/Sulfuric Acid ($H_2SO_4$) and the structure can be cleaned by wet chemical cleanup processes.

Figure 6:
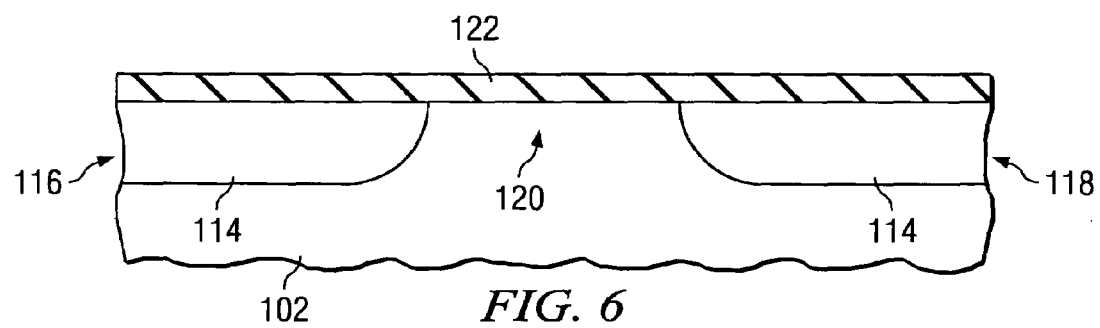
FIG. 6 illustrates a schematic cross-sectional view of the structure of FIG. 5 after an oxidation process has been performed in accordance with an aspect of the present invention.

FIG. 6 illustrates the n-well 102 of the structure after an oxidation process is initiated to form a gate dielectric layer 122 (e.g., silicon dioxide ($SiO_2$) layer) over the n-well 102. The gate dielectric layer 122 can have a thickness of about 75 Å to about 125 Å, and be formed by a wet and/or dry thermal oxidation processing. It is to be appreciated that alternate methodologies can be employed to form the gate dielectric layer. For example, any suitable technique (e.g., thermal oxidation, plasma enhanced CVD, thermal enhanced CVD and spin on techniques) may be employed in forming the gate oxide layer. Examples of CVD processes that may be utilized in accordance with an aspect of the present invention, include low pressure CVD (LPCVD), plasma enhanced CVD (PECVD), and rapid thermal CVD (RTCVD). It is to be appreciated, that other types of thin film formation can be employed, such as other deposition techniques (e.g., physical vapor deposition (PVD)) and film growth techniques.

Additionally, alternate materials can be employed to provide the gate dielectric material. The gate dielectric material can be, for example, $SiO_2$ or another suitable oxide material that can perform the operation associated with the gate dielectric material. Examples of some materials that could be utilized as the gate dielectric layer 122 include $AlO_3$, $ZrO_2$, $HfO_2$ (AlHf) $O_x$, $HfO_2$, $La_2O_3$ and $Y_2O_3$ to name a few. Those skilled in the art will understand and appreciate appropriate types of deposition techniques that can be employed to grow suitable crystalline structures to form gate dielectric layers, such as those identified above. It is to be further understood and appreciated that other materials also could be employed to form the gate dielectric layer 122.

Figure 7:
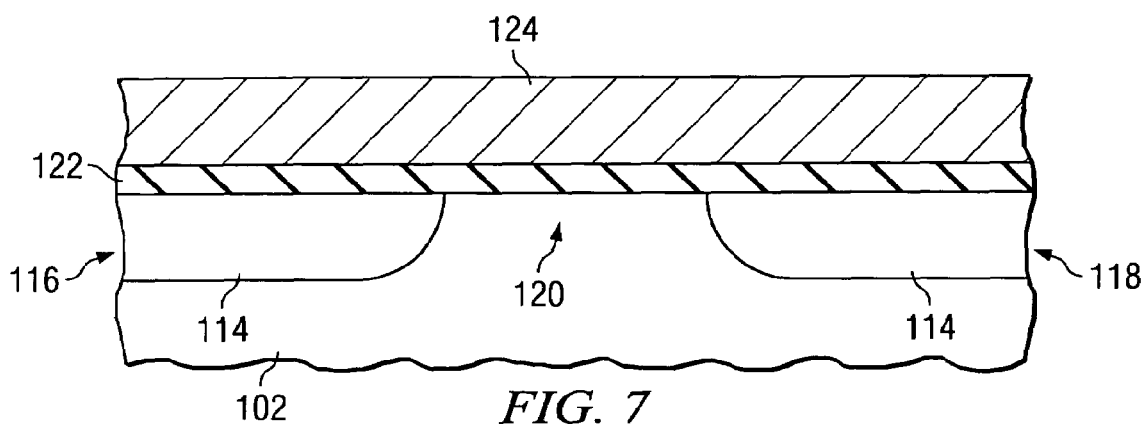
FIG. 7 illustrates a schematic cross-sectional view of the structure FIG. 6 after a conductive layer has been deposited in accordance with an aspect of the present invention.

FIG. 7 illustrates that a conductive layer 124 can be deposited over the dielectric layer 122 to provide the floating gate. If the conductive layer 124 is comprised of polysilicon, the conductive layer 124 may be formed using any suitable technique including CVD techniques, such as LPCVD or PECVD. The polysilicon can be formed in a polycrystalline state or an amorphous state, which is later converted to a crystalline state. The polysilicon can also be formed using in-situ doping techniques and implantation techniques. If the conductive layer 124 is comprised of amorphous silicon or germanium, standard deposition techniques may be employed. If the conductive layer 124 is comprised of a metal, standard sputtering techniques may be employed.

Figure 8:
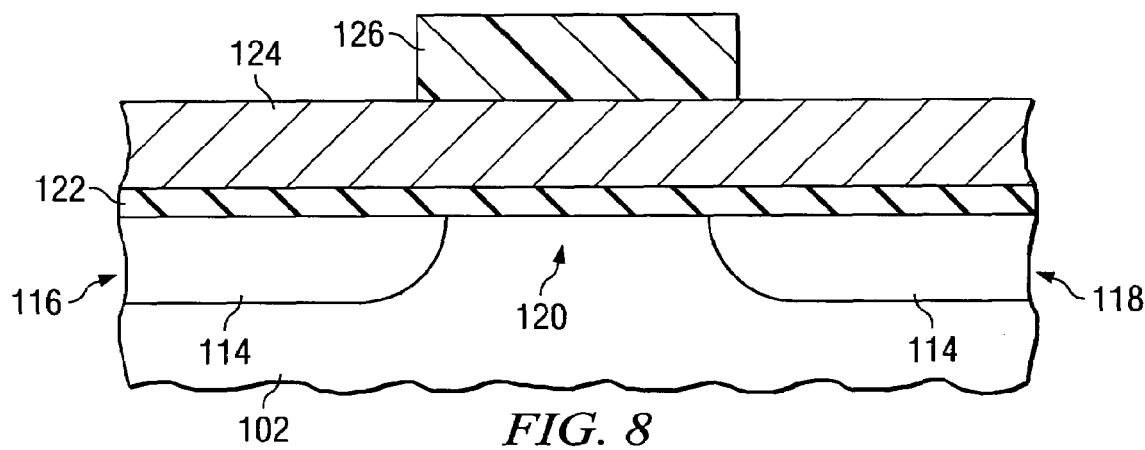
FIG. 8 illustrates a schematic cross-sectional view of the structure of FIG. 7 after a mask has been formed overlying the conductive layer in accordance with an aspect of the invention.

FIG. 8 illustrates the PMOS structure after a third patterned photoresist layer 126 is formed over the conductive layer 124. The third patterned photoresist layer 126, like the first patterned photoresist layer 106 and second patterned photoresist layer 110, can have a thickness suitable for carrying out the present invention. Accordingly, the thickness of the patterned photoresist layer 126 can vary in correspondence with the wavelength of radiation used to pattern the photoresist layer. The patterned photoresist layer 126 can be formed by providing a photoresist layer over the conductive layer 124 via conventional spin-coating or spin casting deposition techniques. An etch step (e.g., anisotropic reactive ion etching (RIE)) can be performed to provide the patterned photoresist layer 126. The patterned photoresist layer 126 can be used as a mask 126 to define the area of the floating gate during a subsequent etching process.

Figure 9:
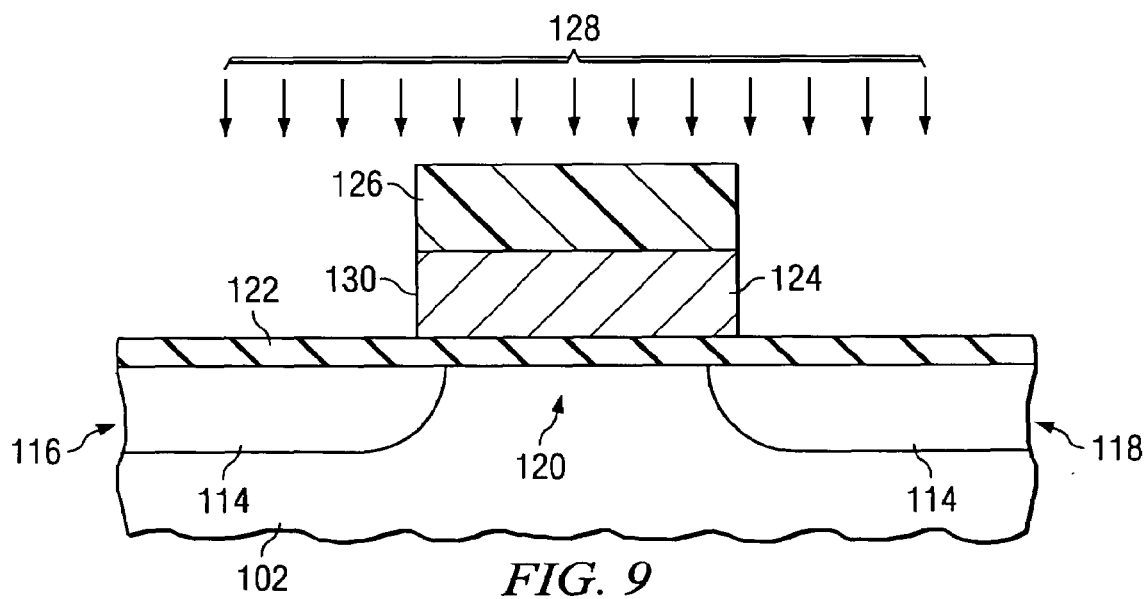
FIG. 9 illustrates a schematic cross-sectional view of the structure of FIG. 8 undergoing an etch to remove a portion of the conductive layer in accordance with an aspect of the invention.

FIG. 9 illustrates an etching process 128 being performed (e.g., chemical wet etching) to remove the conductive layer from the substrate to form the floating gate 130. Any suitable etch technique can be used to etch the conductive layer 124. For example, the conductive layer 124 can be anisotropically etched with a plasma gas(es), (e.g., carbon tetrafluoride ($CF_4$) containing fluorine ions) in a commercially available etcher, such as a parallel plate RIE apparatus, or an electron cyclotron resonance (ECR) plasma reactor. Any combination of a wet or dry etch process can be employed to etch the conductive layer 124. In one aspect, a selective etch technique is used to etch the conductive layer 124 at a relatively greater rate as compared to the rate of the patterned photoresist layer 126.

Following etching and formation of floating gate 130, the third patterned photoresist layer 126 can be stripped off the floating gate 130 (e.g., Ultra-Violet (UV)/Ozone ($O_3$)/Sulfuric Acid ($H_2SO_4$) and the structure can be cleaned by wet chemical cleanup processes.

Figure 10:
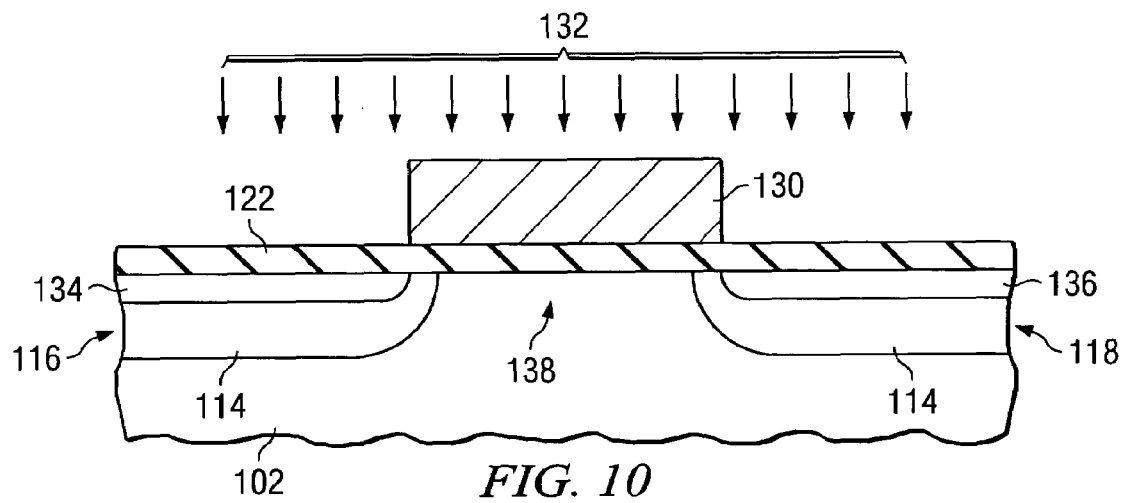
FIG. 10 illustrates a schematic cross-sectional view of the structure of FIG. 9 undergoing the ion implantation to form the source and drain regions in accordance with an aspect of the invention.

FIG. 10 illustrates the PMOS structure after an implantation process 132 is initiated to form the source region 134, drain region 136, and channel region 138 in the n-well 102 of the structure. The implantation process 132 can be performed using an ion implanter that initially accelerates a $p^-$ lightly doped drain implants ($p^-$LDD implants) into the n-well 102. The $p^-$LDD implants can comprise p-type dopants, such as B, $B_{11}$, and/or $BF_2$. Those skilled in the art will understand and appreciate that other dopants can be used as the $p^-$LDD implant. Following implantation of the $p^-$LDD implant, the n-well can then be implanted with a medium and/or high dose $p^+$ source/drain implant, such as B, $B^{11}$, and/or $BF_2$. The $p^+$ source/drain implant penetrates the n-well slightly below the LDD junction depth to define source and drain regions with a high $p^+$ impurity content. Those skilled in the art will understand and appreciate that other dopants can be used as the $p^+$ source/drain implant.

The $p^-$LDD implant and $p^+$S/D implant can be effectively blocked by the floating gate 130 during implantation of the n-well 102 to define the channel region 138 between the source region 134 and drain region 136. The channel region 138 can be essentially aligned below the overlying floating gate 130.

Following formation of the source region 134 and drain region 136 additional processing steps can be performed to complete the PMOS structure. For example, the source region 134 and drain region 136 can be silicided to reduce contact resistance.

Those skilled in the art will also understand and appreciate that variations in the processing operations can be utilized in the formation of an OTP-EPROM cell in accordance with an aspect of the present invention. For example, it is to be appreciated that an n-type substrate material can be provided instead of providing a p-type substrate material and forming an n-well in the p-type substrate material. It is also to be appreciated that trench isolation regions can be formed in the substrate to define an active region in which the n-well is formed. It is further to be appreciated that first dielectric layer can be formed overlying the n-well prior to forming the first photoresist layer and implanting the threshold voltage implant. The $V_{tp}$ implant can readily pass through the first dielectric layer during implantation. Additionally, it is to be appreciated that the PMOS structure can be annealed after implanting the n-well implant and/or threshold voltage to allow diffusion of the n-well and/or the threshold voltage implant into the substrate. Moreover, it is appreciated that during formation of a plurality of the OTP-EPROM cells on a substrate that mask used to block the $V_{tp}$ implant can comprise the same mask used to block the $V_{tp}$ implant into NMOS structures that can potentially be formed on the substrate. As a result, no additional masks are required during fabrication of a plurality of OTP-EPROM cells on a substrate. It is further appreciated, that a dielectric layer can be formed over the floating gate by, for example, thermal oxidation, to isolate the floating gate layer from a control gate layer. A control gate can then be formed overlying the dielectric layer. The dielectric layer overlying the floating gate and the control gate layer can then be etched to form a stacked gate structure.

Figure 11:
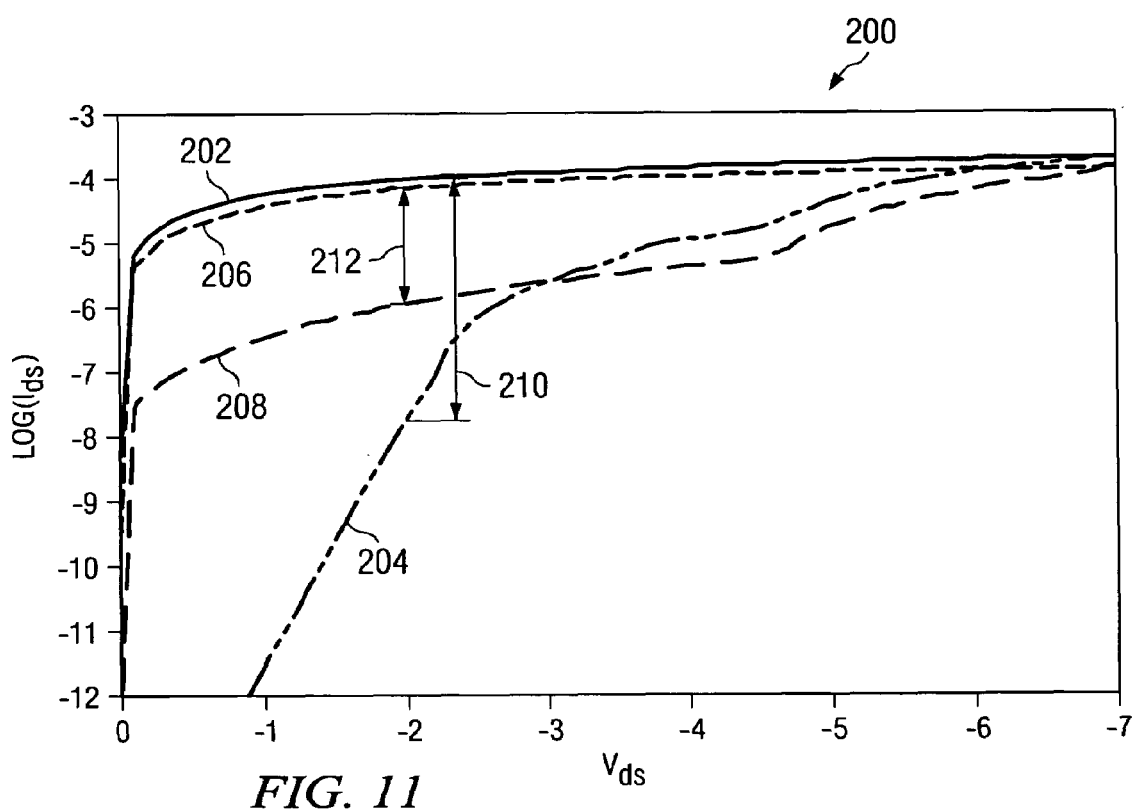
FIG. 11 illustrates a graph comparing the programmed state drain current and virgin state drain current versus voltage for an OTP-EPROM cell with a natural channel region and an OTP-EPROM cell with a $V_{tp}$ implanted channel region.

FIG. 11 illustrates a graph 200 comparing the drain to source current (log(Ids) μA) versus the drain to source voltage (Vds) for an OTP-EPROM cell, which was formed with a natural PMOS channel region (i.e., natural OTP-EPROM cell), and an OTP-EPROM cell, which was formed with a $V_{tp}$ implanted channel region (i.e., $V_{tp}$ implanted OTP EPROM cell). Both the natural OTP-EPROM cell and the $V_{tp}$ implanted OTP-EPROM cell had a channel length of about 0.8 μm. A first indicator 202 references a plot of the drain to source current versus voltage of a natural OTP-EPROM cell in a programmed state. A second indicator 204 references a plot of the drain to source current versus voltage of a natural OTP EPROM cell in a virgin state (i.e., unprogrammed or erased state). A third indicator 206 references a plot of the drain to source current versus voltage of a $V_{tp}$ implanted OTP-EPROM in a programmed state. A fourth indicator 208 references a plot of the drain to source current versus voltage of a $V_{tp}$ implanted OTP-EPROM in a virgin state.

As illustrated in the graph 200, the difference between the programmed state and virgin state current of the natural OTP-EPROM cell was substantially greater than the programmed state and virgin state current of the $V_{tp}$ implanted OTP-EPROM cell. For example, at −2 V, which can be the maximum voltage applied on the drain to read the current, the current measured for the natural OTP-EPROM cell in a programmed state was about 37.9 μA and the current measured for the natural OTP-EPROM cell in a virgin state was about 1.3×10−6 μA. This margin is indicated at 210. In comparison, at −2 V, the drain to source current measured for the $V_{tp}$ implanted OTP-EPROM in a programmed state was 43.4 μA and the drain to source current measured for the $V_{tp}$ implanted OTP-EPROM cell in a virgin state was 0.2 μA. This margin is indicated at 212. At −2V, the I programmed/I virgin ratio for the natural OTP-EPROM cell was about $1 \times 10^6$ times greater than the I programmed/I virgin ratio for the $V_{tp}$ implanted OTP-EPROM cell. Accordingly, at similar channel lengths, the natural OTP-EPROM cell exhibited a substantially improved operating margin compared to the Vp implanted OTP-EPROM cell. Moreover, natural OTP-EPROM cells can be fabricated with smaller channel lengths that have improved operating margins compared to $V_{tp}$ implanted OTP-EPROMS that have greater channel lengths. Smaller channel lengths allow for smaller OTP-EPROM cells and hence greater density memory devices.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabrication of a buried channel PMOS memory cell, the method comprising:
   forming an n-well in a substrate material;
   introducing a threshold voltage implant into the n-well to form a first buried channel region, a second buried channel region, and a natural channel region, the natural channel region separating the first channel region and second channel region and being essentially free of the threshold voltage implant; and
   forming a floating gate structure substantially overlying the natural channel region.

2. The method of claim 1, the threshold voltage implant comprising a threshold voltage PMOS implant.

3. The method of claim 2, the threshold voltage implant comprising at least one of a phosphorous dopant and a boron difluoride dopant.

4. The method of claim 3, the phosphorous dopant can be introduced into the n-well at a concentration in a range from about $2 \times 10^{12}$ cm$^2$ to about $16 \times 10^{12}$ cm$^2$ and an energy in a range from about 100 keV to about 200 keV, and the $BF_2$ dopant being introduced into the n-well at a concentration in a range from about $2 \times 10^{12}$ cm$^2$ to about $4 \times 10^{12}$ cm$^2$ and energy in a range from about 60 keV to about 80 keV.

5. The method of claim 1, further comprising blocking the threshold voltage implant during the introduction of the threshold voltage implant into the n-well to inhibit the threshold voltage from penetrating the natural channel region.

6. The method of claim 5, the blocking being performed by providing a mask overlying a portion of the n-well prior to introduction of the threshold voltage implant into the n-well.

7. The method of claim 6, the area of the n-well comprising essentially the natural channel region.

8. The method of claim 7, the mask being formed by providing a photoresist layer over the n-well and patterning the photoresist layer to expose portions of the n-well that are to be introduced with the threshold voltage implant.

9. A method for fabrication of a buried channel PMOS memory cell, the method comprising:
   forming an n-well in a substrate material;
   masking a portion of the n-well;
   introducing a threshold voltage implant into the n-well to form a first buried channel region and a second buried channel region, the masked portion inhibiting the introduction of the threshold voltage implant into a portion of the n-well that defines a natural channel region, the blocked portion of the n-well being essentially free of the threshold voltage implant; and
   forming a floating gate structure substantially overlying the portion of the n-well substantially free of the threshold voltage implant.

10. The method of claim 9, the threshold voltage implant comprising a threshold voltage PMOS implant.

11. The method of claim 10, the threshold voltage implant comprising at least one of a phosphorous dopant and a boron difluoride dopant.

12. The method of claim 11, the phosphorous dopant can be introduced into the n-well at a concentration in a range from about $2 \times 10^{12}$ cm$^2$ to about $16 \times 10^{12}$ cm$^2$ and at an energy in a range from about 100 keV to about 200 keV, and the $BF_2$ dopant being introduced into the n-well at a concentration in a range from about of about $2 \times 10^{12}$ cm$^2$ to about $4 \times 10^{12}$ cm$^2$ and at an energy in a range from about 60 keV to about 80 keV.

13. The method of claim 9, the masking further comprising providing a photoresist layer over the n-well and patterning the photoresist layer to expose portions of the n-well that are to be introduced with the threshold voltage PMOS implant.

14. The method of claim 9, further comprising forming a source region in the first buried channel region and a drain region in the second buried channel region.

15. The method of claim 14, the source region being formed by introducing a p-LDD implant into the first buried channel region and the drain region being formed by introducing a p-LDD implant into the drain region.

16. The method of claim 15, further comprising introducing a p+ implant into the source region and a p− implant into the drain region.

17. The method of claim 9, the gate structure being formed by forming a gate dielectric layer overlying the n-well, and forming a floating gate overlying the gate dielectric, the floating gate being substantially aligned over the natural channel region.

18. A method for fabrication of a buried channel PMOS memory cell, the method comprising:
  forming an n-well in a substrate material;
  providing a mask overlying a portion of the n-well;
  introducing a threshold voltage implant into the n-well to form a first buried channel region and a second buried channel region, the mask blocking the introduction of the threshold voltage implant into a natural channel region of the n-well, the natural channel region of the n-well being essentially free of the threshold voltage implant;
  forming a gate dielectric layer overlying the n-well; and
  forming a floating gate overlying the gate dielectric layer and the natural channel region.

19. The method of claim 18, the threshold voltage implant comprising a phosphorous dopant and a boron difluoride dopant.

20. The method of claim 19, the phosphorous dopant can be introduced into the n-well at a concentration in a range from about $2 \times 10^{12}$ cm$^2$ to about $16 \times 10^{12}$ cm$^2$ and at an energy in a range from about 100 keV to about 200 keV, and the BF$_2$ dopant being introduced into the n-well at a concentration in a range from about of about $2 \times 10^{12}$ cm$^2$ to about $4 \times 10^{12}$ cm$^2$ and at an energy in a range from about 60 keV to about 80 keV.

21. The method of claim 18, the mask being formed by providing a photoresist layer over the n-well and patterning the photoresist layer to expose portions of the n-well that are to be introduced with the threshold voltage PMOS implant.

22. The method of claim 18, further comprising forming a source region in the first buried channel region and a drain region in the second buried channel region.

23. The method of claim 22, the source region being formed by introducing a p-LDD implant into the first buried channel region and the drain region being formed by introducing a p-LDD implant into the drain region.

* * * * *